US011060840B2

(12) United States Patent
Dai et al.

(10) Patent No.: US 11,060,840 B2
(45) Date of Patent: *Jul. 13, 2021

(54) SYSTEMS AND METHODS FOR HIGH PRECISION CABLE LENGTH MEASUREMENT IN A COMMUNICATION SYSTEM

(71) Applicant: Marvell Asia Pte, Ltd, Singapore (SG)

(72) Inventors: Shaoan Dai, San Jose, CA (US); Kok-Wui Cheong, Los Altos, CA (US); Zhenzhong Gu, San Jose, CA (US)

(73) Assignee: Marvell Asia Pte, Ltd., Singapore (SG)

( * ) Notice: Subject to any disclaimer, the term of this patent is extended or adjusted under 35 U.S.C. 154(b) by 75 days.

This patent is subject to a terminal disclaimer.

(21) Appl. No.: 16/259,288

(22) Filed: Jan. 28, 2019

(65) Prior Publication Data

US 2019/0257636 A1    Aug. 22, 2019

Related U.S. Application Data

(63) Continuation of application No. 15/470,655, filed on Mar. 27, 2017, now Pat. No. 10,190,862.

(Continued)

(51) Int. Cl.
*G01B 7/02* (2006.01)
*G01R 31/00* (2006.01)
*G01R 31/28* (2006.01)

(52) U.S. Cl.
CPC .............. *G01B 7/026* (2013.01); *G01B 7/02* (2013.01); *G01R 31/006* (2013.01); *G01R 31/2832* (2013.01)

(58) Field of Classification Search
CPC .................................. G01B 7/02; G01B 7/026
See application file for complete search history.

(56) References Cited

U.S. PATENT DOCUMENTS 5,062,703 A    11/1991 Wong et al.
7,239,680 B2 *  7/2007 Bui .................... H04L 25/0216
                                                          370/242

(Continued)

FOREIGN PATENT DOCUMENTS

CN    102 426 363    4/2012
JP    2007528152     10/2007
WO    WO 2005078995  8/2005

OTHER PUBLICATIONS

T. Kimura et al., "Time division multiplexed OTDR system," Electronics Letters, 21: 1070-1071 (1985).

(Continued)

*Primary Examiner* — Walter L Lindsay, Jr.
*Assistant Examiner* — Milton Gonzalez

(57) ABSTRACT

Systems are provided for cable length measurement in a communication system. The systems include a transmitter, a receiver, a signal sampler and a cable length calculation unit. The transmitter is configured to transmit a plurality of data symbols at a first data rate via a wired data communication link, and the receiver is configured to receive a reflection signal. The signal sampler is configured to sample the received reflection signal using a phase shift number of shifting sampling phases to generate reflection samples, and combine the reflection samples with different sampling phases to generate a series of reflection samples corresponding to a second data rate higher than the first data rate. The cable length calculation unit is configured to determine a delay parameter from the series of reflection samples, and generate an estimate of a length of the data communication link.

20 Claims, 5 Drawing Sheets

Related U.S. Application Data

(60) Provisional application No. 62/313,683, filed on Mar. 25, 2016.

(56) References Cited

U.S. PATENT DOCUMENTS

| | | |
|---|---|---|
| 8,582,443 B1 | 11/2013 | Sun et al. |
| 9,696,361 B1 * | 7/2017 | Sun ........................ G01R 31/11 |
| 2004/0032921 A1 | 2/2004 | Bui |
| 2006/0181283 A1 | 8/2006 | Wajcer et al. |
| 2009/0147695 A1 | 6/2009 | Barkan et al. |
| 2013/0162262 A1 | 6/2013 | Johnson et al. |
| 2015/0054488 A1 | 2/2015 | Zhang et al. |

OTHER PUBLICATIONS

International Preliminary Report on Patentability for International Application No. PCT/US2017/024359 dated Sep. 25, 2018.
International Search Report and Written Opinion dated Jun. 29, 2017 for PCT/US2017/024359, filed Mar. 27, 2017.

* cited by examiner

SYSTEMS AND METHODS FOR HIGH PRECISION CABLE LENGTH MEASUREMENT IN A COMMUNICATION SYSTEM

CROSS-REFERENCE TO RELATED APPLICATION

This application is a continuation of U.S. patent application Ser. No. 15/470,655, filed Mar. 27, 2017 (now U.S. Pat. No. 10,190,862), which in turn claims the benefit under 35 U.S.C. § 119(e) of U.S. Provisional Patent Application No. 62/313,683, filed Mar. 25, 2016, which are hereby incorporated by reference herein in their entireties.

FIELD OF USE

This disclosure relates to performance measurement of a cable communication system, and specifically, a high precision cable length measurement mechanism.

BACKGROUND OF THE DISCLOSURE

The background description provided herein is for the purpose of generally presenting the context of the disclosure. Work of the inventors hereof, to the extent the work is described in this background section, as well as aspects of the description that does not otherwise qualify as prior art at the time of filing, are neither expressly nor impliedly admitted to be prior art against the present disclosure.

High-speed Ethernet communication is commonly used for computer networking and in recent years has been adapted for use in automotive environments. For example, an automotive cable is used to connect sub-systems of an automobile, including for example engine, braking, steering, safety and various sensor sub-systems. Such cable communication connection is usually subject to stringent electromagnetic interference (EMI) requirements in order to provide safe and efficient transfer of data among the various automobile sub-systems. Characteristics of the cable connection, such as the cable length, are measured to assess the performance of the connection.

Existing methods to measure a cable length include using time domain reflection (TDR) or digital signal processing (DSP) based echo response. In these methods, the measurement resolution is highly dependent on the sampling rate (usually equivalent to the data symbol rate) or the pulse width of the incident signal that is sent to generate a reflection or echo. When the sampling rate, i.e., the transmission data symbol rate, is low, the measurement resolution of the cable length is usually unsatisfactory.

SUMMARY

Embodiments described herein provide a method for cable length measurement in a communication system. At a transmitter, a plurality of data symbols are transmitted at a first data rate via a wired data communication link. In response to the transmitting, at a receiver, a reflection signal is received from the wired data communication link. A phase shift number of shifting sampling phases are obtained, at a signal sampler, for sampling the received reflection signal. The received reflection signal is sampled, at the sampler, based on the phase shift number of shifting sampling phases to generate reflection samples. Each reflection sample corresponds to a sampled value of the received reflection signal shifted by a sampling phase from the phase shift number of shifting sampling phases. The reflection samples with different sampling phases are combined to generate a series of reflection samples corresponding to a second data rate higher than the first data rate. A delay parameter indicative of a transmission time for a signal to transmit from the transceiver to an end of the wired data communication link, is determined based on values of the series of reflection samples. An estimate of a length of the data communication link is generated based at least in part on the determined delay parameter.

In some implementations, a first timestamp is detected corresponding to a center of a mass of the series of reflection samples. A second timestamp of a data symbol is identified corresponding to the center of the mass, and the delay parameter is generated by comparing the first timestamp and the second timestamp.

In some implementations, the estimate of the length of the data communication link is calculated by multiplying a constant signal transmission speed with the delay parameter associated with the plurality of reflection response samples, wherein the estimate of the length has a resolution that is substantially equivalent to a length estimate based on data transmission at the second data rate.

In some implementations, a phase of a data symbol is shifted from among the plurality of data symbols with the phase shift number of shifting sampling phases to generate a series of data symbols. The series of data symbols are transmitted at the second data rate.

In some implementations, reflection noise is removed from the plurality of reflection samples. Reflection coefficients are adapted associated with the plurality of reflection samples. The plurality of reflection samples are combined to obtain a plurality of multi-phase reflection response samples. The plurality of multi-phase reflection samples have the second data rate.

In some implementations, a matching filter is applied to the reflection signal to reduce reflection tail noise. The matching filter increases a signal-to-noise ratio of the analog reflection signal.

In some implementations, a plurality of matching filter coefficients are determined based at least in part on a shape characteristic of the reflection signal at an end of the data communication link, a connector reflection or a bus interface network of the wired data communication link.

In some implementations, the plurality of matching filter coefficients are dynamically updated based at least in part on a shape of the reflection signal to reduce reflection tail noise.

In some implementations, the reflection signal is sampled based on a set of shift sampling phases different from the phase shift number of shift sampling phases to obtain a different set of reflection samples. A different estimate of the length of the wired data communication link is generated based at least in part on the different set of reflection response samples.

In some implementations, the number of the set of shift sampling phases is increased for sampling to increase measurement resolution of the set of shift sampling phases.

BRIEF DESCRIPTION OF THE DRAWINGS

Further features of the disclosure, its nature and various advantages will become apparent upon consideration of the following detailed description, taken in conjunction with the accompanying drawings, in which like reference characters refer to like parts throughout, and in which.

DETAILED DESCRIPTION

Figure 1:
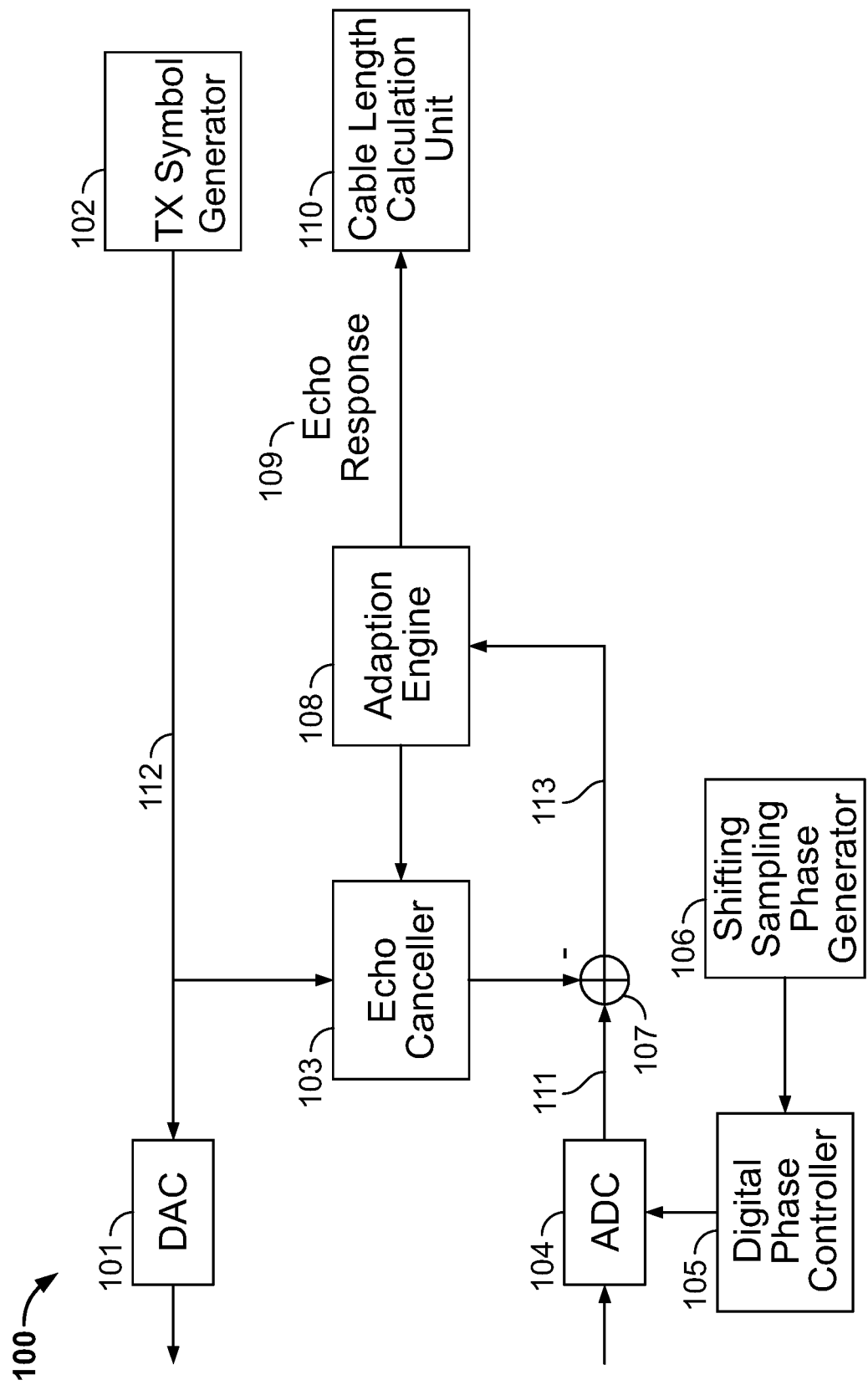
FIG. 1 is a block diagram illustrating DSP echo response based cable measurement with phase shifting sampling, according to some embodiments described herein.

This disclosure describes methods and systems for providing a high precision cable length measurement mechanism by shifting sampling phases of a transmission signal to generate transmission symbols at a higher symbol rate.

In some embodiments, cable length measurement is conducted based on measuring the delay of a reflection signal in response to an incident signal that is sent from the transmitter. An incident signal, e.g., either analog or digital, is usually sent from a transmitter onto a cable connection. When the incident signal reaches the end of the cable, due to the impedance variation at the end of the cable, some of the incident signal will be reflected back to the transmitter in the form of a reflection signal. The shape of the reflection signal is usually substantially similar to the transmitted incident signal. The speed of signal propagation is almost constant for a given transmission medium, e.g., a copper or optical cable. Thus, the transmission delay of the incident signal to transmit from the transmitter to the end of the cable, and then reflect back from the end of the cable to the transmitter, is usually measured to calculate an estimate of the cable length. If the transmission delay is represented as $\tau$, and the signal travel speed $\upsilon$ is considered as a constant, an estimate of the cable length d is calculated as $d=\upsilon \tau/2$. Thus, the measurement resolution of the delay parameter $\tau$ determines the measurement resolution of the cable length d.

The transmission delay is usually measured by identifying signal peaks of the reflection signal. For example, a first timestamp of a signal peak in the incident signal is recorded, and then the corresponding signal peak in the reflection signal needs to be detected. A second timestamp associated with corresponding signal peak in the reflection signal is used to subtract the first timestamp to obtain the transmission delay parameter $\tau$.

In detecting a signal peak of the reflection signal, the sampling period and/or the pulse width of the incident signal affect the measurement resolution, because a signal section of the entire pulse width can sometimes be identified as the "peak." Thus when the data symbol rate is relatively low, meaning the sampling period and the pulse width of the incident signal are relatively large, the "peak" section of the received reflection signal is in turn relatively wide, resulting in relatively low precision in the detected "peak" of the received reflection signal.

For example, when a symbol rate of 66.7 mega-symbols per second (MSPS) is used in a 100BASE-T1 system, the measurement resolution of the delay parameter $\tau$ is 15 ns and thus the corresponding cable measurement resolution is around 1.5 m. In an automotive environment where the cable length is usually less than 8 m, such measurement resolution of around 1.5 m typically does not provide sufficient technical accuracy and precision.

Embodiments described herein provide a phase shifting sampling mechanism to effectively increase the sampling rate or the data symbol rate, which in turn enhances the measurement resolution of reflection delay, in a system with a low symbol rate. A set of shifting sampling phases is used to sample data symbols to be transmitted onto a cable connection, or a reflection signal received from the cable connection. The set of shifting sampling phases contains a number of shifting sampling phases, $\theta_1, \theta_2, \ldots, \theta_n$, each representing a shifting phase of the sampling signal. Each sampling phase from the set of shifting sampling phases is used to sample the same signal. For example, to sample a sampling signal $s(2\pi t)$ with a shifting phase of $\theta_1$, is similar to "shifting" the sampling signal along the time axis for an amount of $\theta_1/2\pi$, and taking a sample point at the time instant t. The resulting signal sample is $s[2\pi(t-\theta_1)]$. Thus, data symbols to be transmitted, or a received signal, are to be sampled n times, each time with a sampling phase from the set of shifting sampling phases, $\theta_1, \theta_2, \ldots, \theta_n$. By doing the multi-phase sampling, more data samples (with different sampling phases) are generated as compared to only sampling the data symbols or the received signal once.

In some implementations, data symbols to be transmitted are sampled and re-transmitted with the set of shifting sampling phases. For example, each data symbol for transmission is re-transmitted multiple times, each time with a shifting phase from the number of shifting sampling phases, $\theta_1, \theta_2, \ldots, \theta_n$. Thus, as each data symbol is transmitted and repeated in the form of a plurality of symbols with different shifted phases, the data symbol rate is "virtually" increased, resulting in a narrower pulse width of the transmitted signal. Thus the reflection signal, in response to the transmitted signal, in turn has a narrower pulse width for "peak" detection and thus a more precise measurement.

In another implementation, when a reflection or echo signal is received from the cable connection, in response to the transmission of the data symbols, the reflection signal is sampled with the number of shifting sampling phases, $\theta_1, \theta_2, \ldots, \theta_n$, e.g., by time-shifting the received reflection signal according to each shifting sampling phase, and then taking a sample at a time instant. Thus, a series of reflection samples are generated, which has a quantity equivalent to reflection samples generated under a higher data symbol rate, e.g., similar to the "virtually" increased symbol rate as discussed above. With the "virtually" increased symbol rate and hence narrower pulse width, detection of the "peak" in the received reflection signal achieves enhanced resolution.

As a result, when either the transmitted symbols or the received reflection signal are sampled with the shifting sampling phases, the measurement resolution of reflection delay is improved, and the measurement resolution of the cable length is in turn improved as well.

FIG. 1 is a block diagram illustrating DSP echo response based cable measurement with phase shifting sampling, according to some embodiments described herein. The DSP echo response based cable measurement technique is implemented at a suitably configured DSP transceiver 100, in an embodiment. The DSP transceiver 100 is configured to obtain data symbols 112 to transmit at a transmitter symbol generator 102, and in one implementation, all the data symbols 112 are converted to an analog signal at a digital-to-analog converter 101. In another implementation, the data symbols are transmitted in a digital form. The data symbols or the converted analog signal is then transmitted via a communication link, e.g., an Ethernet cable for example.

The DSP transceiver 100 also contains a receiver component where a digital phase controller 105 is configured to sample a received analog signal, e.g., a reflection signal, at the analog-to-digital converter (ADC) 104. The shifting sampling phases generator 106 is configured to generate a plurality of shifting sampling phases based on a phase shift number n. In some implementations, the phase shift number n is predefined. In some other implementations, the phase shift number n is dynamically adjusted to obtain different sets of shifting sampling phases. For example, when the phase shift number n=4, the shifting sampling phases are 0, $\pi/4$, $\pi/2$, and $3\pi/4$. Thus the resulting samples 111 of the received signal, which is represented by r(t), are r[4k], r[4k+1], r[4k+2] and r[4k+3], k=0, 1, . . . , m−1, where m is the maximum number of reflection response taps along the cable, usually determined by the cable length.

The output samples 111 with shifting phases from the ADC 104, r[4k], r[4k+1], r[4k+2] and r[4k+3], k=0, 1, . . . , m−1, are then processed to cancel echo noise by the echo canceller 103. For example, the echo canceller 103 is configured to, in one implementation, adopt common echo suppression or echo cancellation techniques. The transmission symbols 112, after echo cancellation at the echo canceller 103, are subtracted from the output samples 111 at the logic operator 107, to generate a signal 113 with echo cancelled. The echo-cancelled signal 113 is then provided to an adaptation engine 108, at which the echo coefficients of the signal 113 are adapted accordingly. For example, in an embodiment, the adaptation engine 108 is configured to adapt the echo coefficients to minimize the energy of the echo noise, e.g., by recursive least square error (RLS) or the least mean squared error (LMS) methods. After echo adaption is performed at adaptation engine 108, the echo response 109 is generated. For example, when the phase shift number n=4, and the shifting sampling phases are 0, n/4, n/2, and 3n/4, four groups of echo responses 109 are generated, represented by ec(4k), ec(4k+1), ec(4k+2) and ec(4k+3), respectively, k=0, 1, . . . , m−1.

As the transmitter to receiver latency is fixed, in an embodiment, the echo responses with different phase shifts, e.g., ec(4k), ec(4k+1), ec(4k+2) and ec(4k+3), are combined to get a multi-phase reflection, which is equivalent to the echo responses with an n-times higher sampling rate, where n is the phase shift number. Thus in the above example, as each of the echo responses ec(4k), ec(4k+1), ec(4k+2) and ec(4k+3) generates a delay measurement, the delay resolution is four times more precise, e.g., the delay resolution after phase shifting sampling=delay resolution without phase shifting sampling/4.

As such, when the delay measurement associated with the echo responses 109 is used to calculate the cable length at the cable length calculation unit 110, the cable length resolution is also four-times more precise in the above example as compared to measurement with original received reflection signal without phase shifting sampling.

In another implementation, instead of sampling the received reflection signal with shifting sampling phases from a shifting sampling phase generator 106 at ADC 104, the transmission symbol generator 102 is configured to shift the phase of each data symbol. For example, for each data symbol t[n] and a set of shifting sampling phases 0, $\pi/4$, $\pi/2$, and $3\pi/4$, a sequence of data symbols is generated at the transmission symbol generator 102 via phase-shifting circuitry, i.e., t[4k], t[4k+1], t[4k+2], t[4k+3], . . . . Thus the set of resulting data symbols after shifting phase sampling contains four times more data symbols to transmit within a same period of time, and thus can be considered as a four-times higher data symbol date. The data symbols are then passed on to the DAC 101 with different shifting phases to generate a transmission signal. In this way, the transmission signal with multi-phase sequence yields a higher symbol rate. Specifically, with the higher symbol rate, in an embodiment, the transmission signal has a smaller pulse width as compared to an original transmission signal if no shifting phase sampling was performed at the transmission symbol generator 102. In response to the higher symbol rate of the transmission signal, any reflection signal would have a similarly smaller pulse width. As a result, as discussed above, the resolution of detecting a "peak" of the reflection signal is enhanced in this way, and thus yields measurement of the reflection delay with better resolution.

Figure 2:
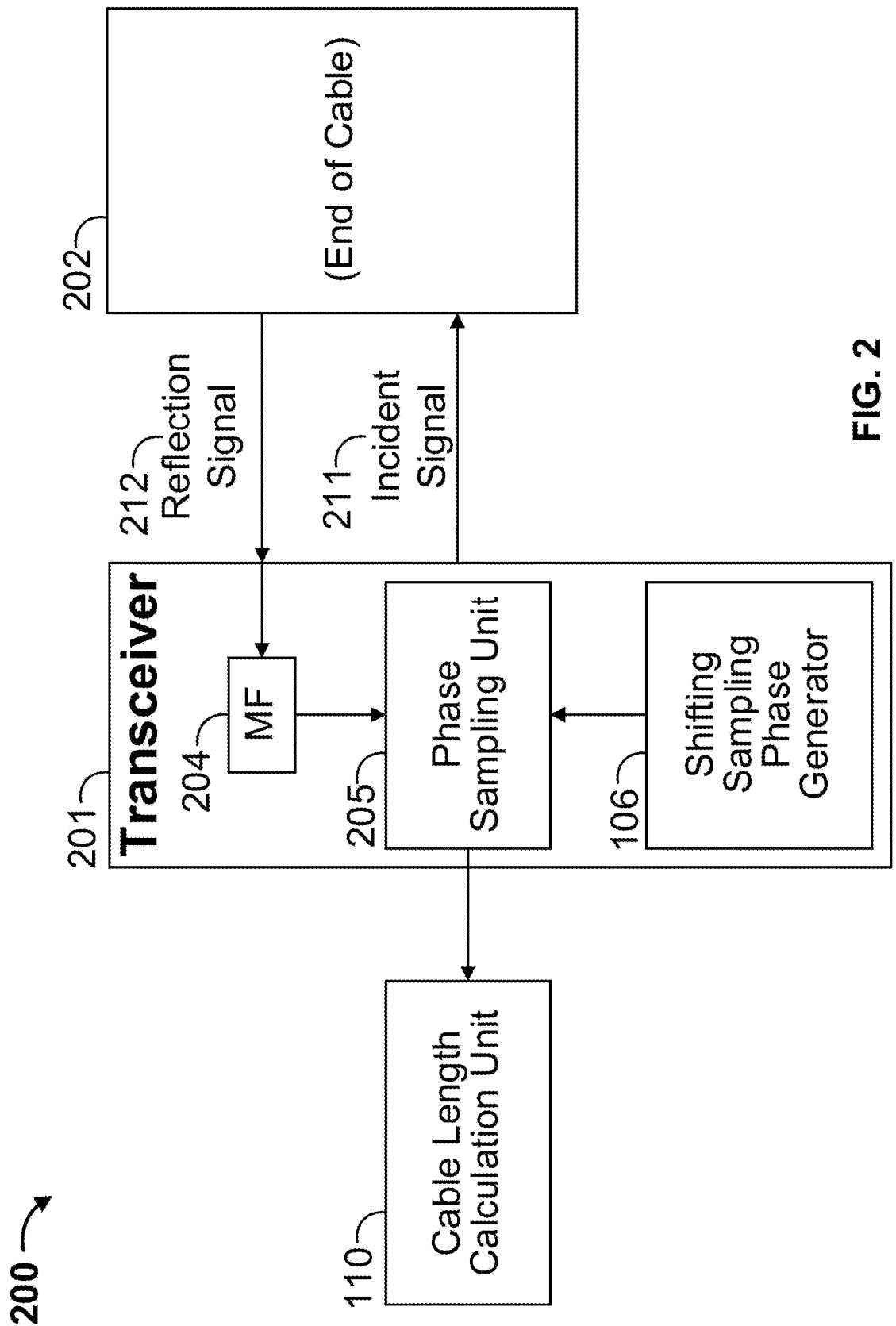
FIG. 2 is a block diagram illustrating TDR based cable measurement with phase shifting sampling and a matching filter (MF) to increase signal-to-noise ratio (SNR) of the received reflection signal, according to some embodiments described herein.

FIG. 2 is a block diagram illustrating TDR based cable measurement with phase shifting sampling and a matching filter (MF) to increase signal-to-noise ratio (SNR) of the received reflection signal, according to some embodiments described herein. The phase shifting sampling as shown in FIG. 1 can be applied to the TDR mechanism 200 as well. As shown in FIG. 2, the TDR transceiver 201 is configured to send an incident signal 211, which is reflected at the end of the cable 202, and the reflection signal 212 is transmitted back to the transceiver 201. A shifting sampling phase generator 106, e.g., similar to 106 discussed in connection with FIG. 1, is configured to generate a plurality of shifting sampling phases, which are transmitted to the phase sampling unit 205 (e.g., similar to 106 in FIG. 1) is configured to sample the reflection signal 212 with a plurality of shifting sampling phases. For example, if the reflection signal 212 is represented as r(t), with example shifting sampling phases 0, $\pi/4$, $\pi/2$, and $3\pi/4$, the reflection samples are r[4k], r[4k+1], r[4k+2] and r[4k+3], k=0, 1, . . . , m−1, where m is the maximum tap number. In this way, the generated reflection response samples r[4k], r[4k+1], r[4k+2] and r[4k+3], k=0, 1, . . . , m−1, are four-times "denser" than response samples generated without shifting sampling phases, e.g., equivalent to sampling the received reflection signal with only a phase of 0. The resulting reflection response samples r[4k], r[4k+ 1], r[4k+2] and r[4k+3], k=0, 1, . . . , m−1, thus have an equivalent data rate to reflection response samples obtained at a four-times higher data symbol rate, as described in connection with FIG. 1. Thus, with the four-times higher data symbol rate, a pulse width corresponding to the reflection samples with multi-phases is reduced to be ¼ of the pulse width of the original reflection signal. The measurement resolution of a "peak" of the reflection samples is thus enhanced by four times, and thus measurement resolution of the transmission delay and the cable length are enhanced by four times. Similarly, if the reflection signal 212 is sampled with n shifting phases, e.g., the reflection samples are r[nk], r[nk+1], r[nk+2] . . . r[nk+n−1], k=0, 1, . . . , m−1, where m is the maximum tap number, the measurement resolution of cable length is enhanced n times.

In some implementations, a MF 204 is disposed at the receiver, the MF being configured to process the reflection signal 212 before the reflection signal 212 is sampled at the phase sampling unit 205. For example, when the far end of the cable 202 is properly terminated, there is little reflection and the remaining incident signal 211 is absorbed at the end of the cable 202 by termination. In this case, the received reflection signal 212 is too weak to detect, and the reflection detection can be unreliable due to the reduced signal strength and relatively significant noise. The MF 204 is then used to suppress the noise of the detection of the tail reflection and boost the SNR, in an embodiment.

In some implementations, the MF 204 is configured as a linear filter with coefficients derived by the least squares residual method. For example, the MF coefficients are determined based on the reflection response shape of the cable end, which includes the connector reflection and the Bus Interface Network (BIN). For example, if the terminal reflection response is es(k), k=0, 1, . . . , p−1, where p is a shaping characteristic that indicates the length of the reflection signal in the time-domain, e.g., a shaping the time-duration of the reflection signal reflected from the end of the cable 202, the MF coefficients are determined to be mf(k)=es(−k). Also, the MF is configured to represent the characteristics of the termination impedance at the end of the cable (e.g., 202 in FIG. 2), which is configured to separate the end of the cable and in-line connectors. In some implementations, the MF is configured to be a simple linear filter with the coefficients discussed above to reduce hardware implementation complexity. In some implementations, the MF coefficients are configured to be dynamically adjusted depending on characteristics of the received reflection signal, in order to achieve a desirable SNR.

Figure 3:
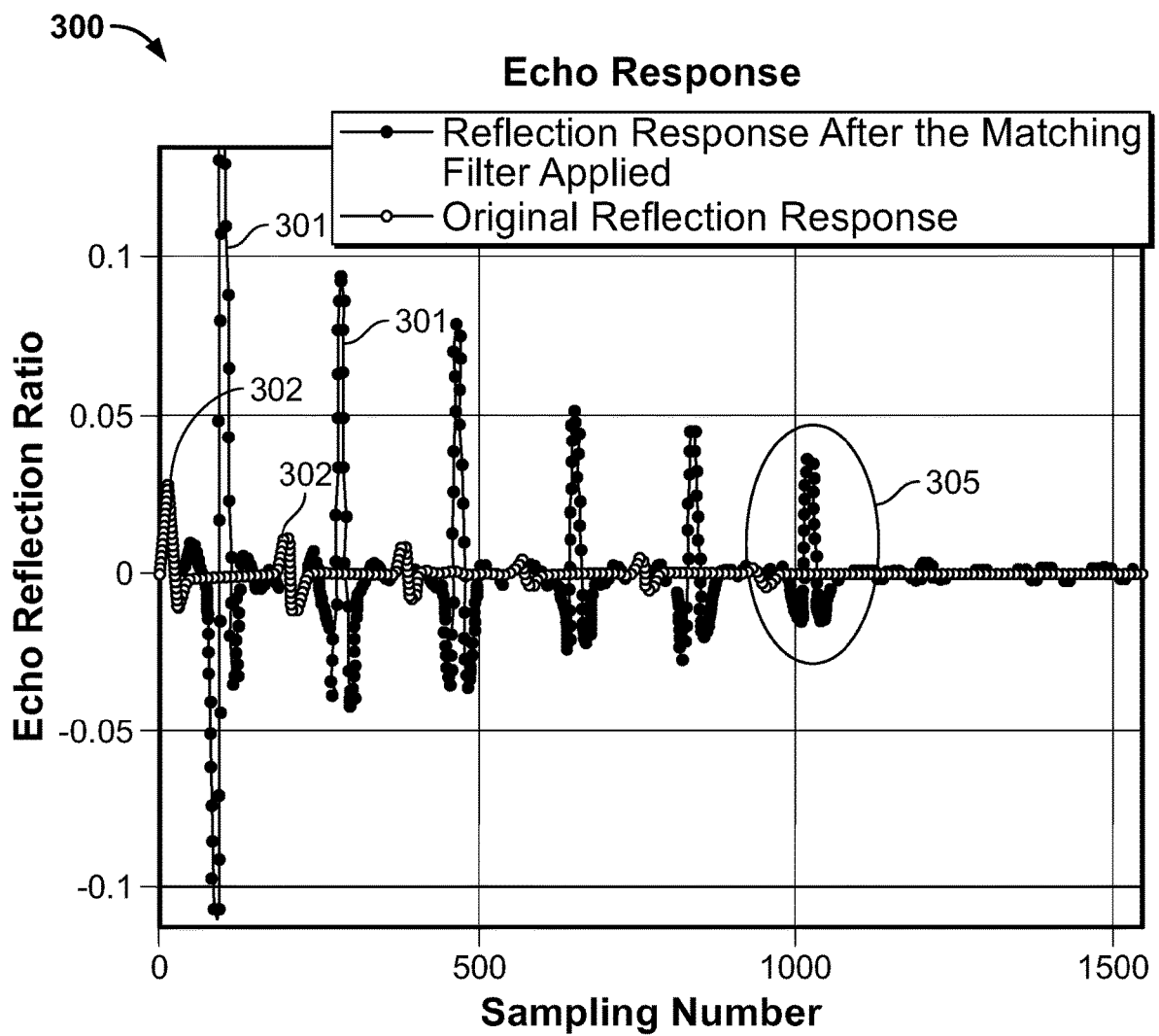
FIGS. 3-4 provide data plot diagrams illustrating a reflection response with increased SNR after an MF is applied, according to some embodiments described herein.
Figure 4:
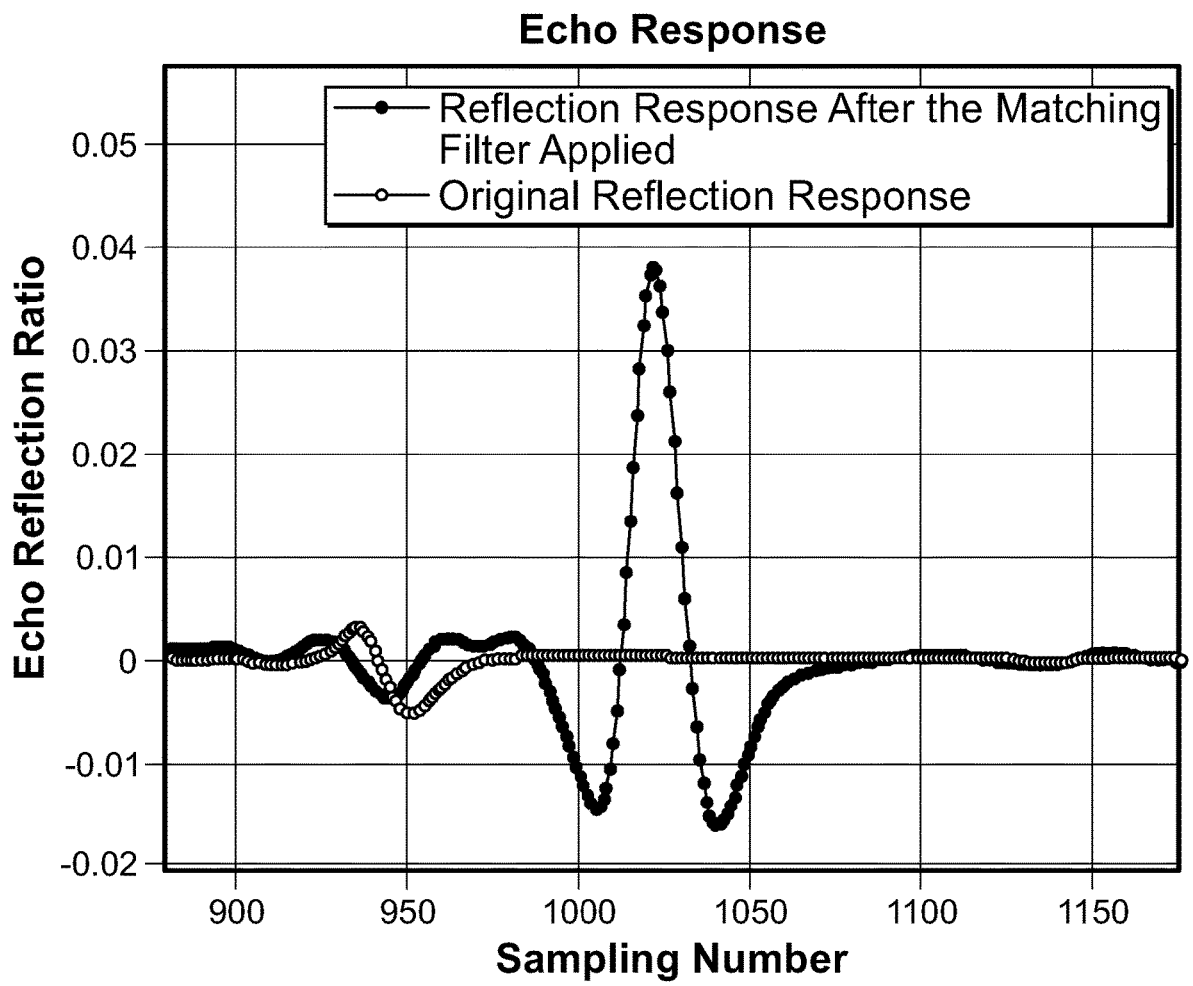

FIGS. 3-4 provide data plot diagrams illustrating a reflection response with increased SNR after an MF is applied, according to some embodiments described herein. As shown in data plot diagram 300, the reflection response signal (e.g., 212 in FIG. 2) after the MF (e.g., 204 in FIG. 2) is applied (as illustrated by the signal plot 301), has a greater amplitude than the original reflection response signal without the MF (as illustrated by the signal plot 302). Thus the peaks of the reflection response signal 301 are more identifiable by detecting the greatest absolute value of the amplitude. An enlarged view 305 of a peak of the reflection signal is provided in FIG. 4. In some implementations, the center of mass of the reflection response signal is measured instead of the peak of the reflection response signal, as the center of mass of the signal is less noisy to detect and with lower measurement error, especially with limited response tap number.

Figure 5:
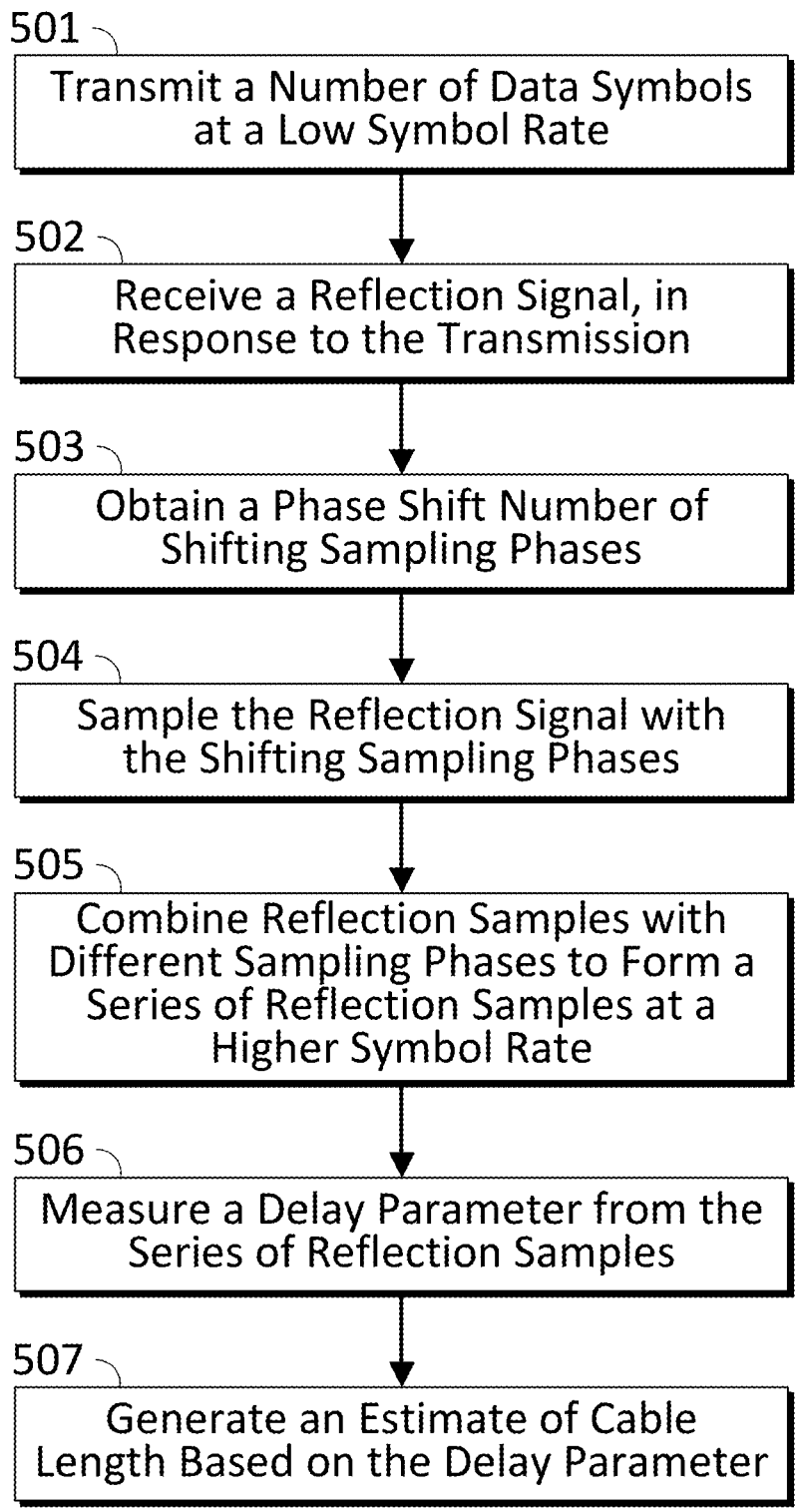
FIG. 5 provides an example logic flow diagram illustrating aspects of measuring cable length with enhanced precision in a low data symbol rate environment, according to some embodiments described herein.

FIG. 5 provides an example logic flow diagram illustrating aspects of measuring cable length with enhanced precision in a low data symbol rate environment, according to some embodiments described herein. At 501, a number of data symbols are transmitted to a cable connection at a low symbol rate, e.g., at 66.7 MSPS in a 100BASE-T1 system. At 502, a reflection signal (e.g., 212 in FIG. 2) is received from the cable connection, in response to the transmission of the data symbols. At 503, a phase shift number, e.g., n, of shifting sampling phases are obtained for sampling. For example, when n=4, four shifting sampling phases of 0, π/4, π/2, and 3π/4 are to be used. At 504, the received reflection signal is sampled with the shifting sampling phases. For example, when the four shifting sampling phases of 0, π/4, π/2, and 3π/4 are used, four groups of reflection samples, e.g., ec[4k), ec[4k+1], ec[4k+2] and ec[4k+3], respectively, k=0, 1, . . . , m−1, are obtained using each of the four shifting sampling phases. At 505, the reflection samples obtained with different shifting sampling phases are combined to form a series of reflection samples, e.g., ec(0), ec(1), ec(2), ec(3), ec(4), ec(5), ec(6), ec(7), . . . , ec(4m−4), ec(4m−3), ec(4m−2) and ec(4m−1), which is similar to the reflection samples obtained at a four-times higher symbol rate. Thus at 506, the delay parameter is calculated based on the combined reflection samples, e.g., by detecting and comparing the timestamp of a peak, or the center of the mass of the reflection samples and the timestamp of a peak, or the center of the mass of the transmitted data symbols. The detection of a peak, or the center of the mass of the reflection samples is shown in FIGS. 3-4. At 507, an estimate of the cable length is calculated based on the delay parameter and a constant signal propagation speed of the Ethernet cable connection.

In some implementations, a different set of shifting sampling phases is used to obtain a different set of reflection samples. For example, the shifting sampling phases are configured to change from 0, π/4, π/2, and 3π/4, to 0, π/6, π/3, π/2, 2π/3 and 5π/6. A different series of reflection samples is then generated based on the shifting sampling phases, and thus a different estimate of the length of the cable is in turn generated. The set of shifting sampling phases is configured to be dynamically changed to adapt to different measurement precision requirement, e.g., when the phase shifting number increases, the measurement precision is usually enhanced accordingly.

While various embodiments of the present disclosure have been shown and described herein, such embodiments are provided by way of example only. Numerous variations, changes, and substitutions relating to embodiments described herein are applicable without departing from the disclosure. It is noted that various alternatives to the embodiments of the disclosure described herein may be employed in practicing the disclosure. It is intended that the following claims define the scope of the disclosure and that methods and structures within the scope of these claims and their equivalents be covered thereby.

While operations are depicted in the drawings in a particular order, this is not to be construed as requiring that such operations be performed in the particular order shown or in sequential order, or that all illustrated operations be performed, to achieve the desirable results.

The subject matter of this specification has been described in terms of particular aspects, but other aspects can be implemented and are within the scope of the following claims. For example, the actions recited in the claims can be performed in a different order and still achieve desirable results. As one example, the process depicted in FIG. 10 does not necessarily require the particular order shown, or sequential order, to achieve desirable results. In certain implementations, multitasking and parallel processing may be advantageous. Other variations are within the scope of the following claims.

What is claimed is:

1. A method for cable length measurement in a communication system, the method comprising:
   transmitting, at a transmitter, a plurality of data symbols at a first data rate via a wired data communication link;
   in response to the transmitting, receiving, at a receiver, a reflection signal from the wired data communication link;
   sampling, at a signal sampler, the received reflection signal based on a phase shift number of shifting sampling phases;
   generating, from the sampling, a plurality of reflection samples, wherein the plurality of reflection samples corresponds to a second data rate higher than the first data rate;
   determining, at a cable length calculation unit, a delay parameter based on the plurality of reflection samples corresponding to the second data rate; and
   generating, at the cable length calculation unit, an estimate of a length of the wired data communication link based at least in part on the determined delay parameter.

2. The method of claim 1, wherein sampling, at a signal sampler, the received reflection signal based on a phase shift number of shifting sampling phases comprises:
for each sampled value of the received reflection signal, generating a corresponding set of phase-shifted samples, wherein each of the phase-shifted samples is the sampled value shifted by a sampling phase from the phase shift number of shifting sampling phases; and
combining each set of phase-shifted samples to generate the plurality of reflection samples.

3. The method of claim 1, wherein the delay parameter is indicative of a transmission time for a signal to transmit from the transmitter to an end of the wired data communication link.

4. The method of claim 1, further comprising:
for each data symbol of the transmitted plurality of data symbols, generating a phase shift number of data symbols with different shifted phases corresponding to the phase shift number of shifting sampling phases, and
for each respective data symbol of the phase shift number of data symbols, subtracting the respective data symbol from a respective reflection sample of the phase shift number of reflection samples, respectively, to obtain a plurality of reflection response samples at the second data rate; and
wherein determining, at the cable length calculation unit, the delay parameter based on the plurality of reflection samples comprises determining the delay parameter based on values of the plurality of reflection response samples.

5. The method of claim 4, further comprising:
detecting a first timestamp corresponding to a center of a mass of the plurality of reflection response samples;
identifying a second timestamp of a data symbol corresponding to the center of the mass; and
generating the delay parameter by comparing the first timestamp and the second timestamp.

6. The method of claim 1, further comprising:
calculating the estimate of the length of the data communication link by multiplying a constant signal transmission speed with the delay parameter, wherein the estimate of the length has a resolution that is substantially equivalent to a length estimate based on data transmission at the second data rate.

7. The method of claim 1, further comprising:
shifting a phase of a data symbol from among the plurality of data symbols with the phase shift number of shifting sampling phases to generate a series of data symbols; and
transmitting the series of data symbols at the second data rate.

8. The method of claim 1, further comprising:
applying a matching filter to the reflection signal to reduce reflection tail noise, wherein the matching filter increases a signal-to-noise ratio of the analog reflection signal.

9. The method of claim 8, further comprising:
determining a plurality of matching filter coefficients based at least in part on a shape characteristic of the reflection signal at an end of the data communication link, a connector reflection, or a bus interface network of the wired data communication link.

10. The method of claim 9, further comprising:
dynamically updating the plurality of matching filter coefficients based at least in part on a shape of the reflection signal to reduce reflection tail noise.

11. A system for cable length measurement in a communication system, the system comprising:
a transmitter configured to transmit a plurality of data symbols at a first data rate via a wired data communication link;
a receiver configured to, in response to the transmitting, receive a reflection signal from the wired data communication link;
a signal sampler configured to:
sample the received reflection signal based on a phase shift number of shifting sampling phases;
generate, from the sampling, a plurality of reflection samples, wherein the plurality of reflection samples corresponds to a second data rate higher than the first data rate; and
a cable length calculation unit configured to:
determine a delay parameter based on the plurality of reflection samples corresponding to the second data rate; and
generating, at the cable length calculation unit, an estimate of a length of the wired data communication link based at least in part on the determined delay parameter.

12. The system of claim 11, wherein the signal sampler is further configured to sample the received reflection signal based on a phase shift number of shifting sampling phases by:
for each sampled value of the received reflection signal, generate a corresponding set of phase-shifted samples, wherein each of the phase-shifted samples is the sampled value shifted by a sampling phase from the phase shift number of shifting sampling phases; and
combine each set of phase-shifted samples to generate the plurality of reflection samples.

13. The system of claim 11, wherein the delay parameter is indicative of a transmission time for a signal to transmit from the transmitter to an end of the wired data communication link.

14. The system of claim 11, further comprising:
a reflection canceller configured to:
for each data symbol of the plurality of data symbols, generating a phase shift number of data symbols with different shifted phases corresponding to the phase shift number of shifting sampling phases, and
for each respective data symbol of the phase shift number of data symbols, subtracting the respective data symbol from a respective reflection sample from the phase shift number of reflection samples, respectively, to obtain a plurality of reflection response samples at the second data rate; and
wherein the cable length calculation unit is further configured to determine the delay parameter based on values of the plurality of reflection response samples.

15. The system of claim 14, wherein the cable length calculator is further configured to:
detect a first timestamp corresponding to a center of a mass of the plurality of reflection response samples;
identify a second timestamp of a data symbol corresponding to the center of the mass; and
generate the delay parameter by comparing the first timestamp and the second timestamp.

16. The system of claim 11, wherein the cable length calculator is further configured to:
calculate the estimate of the length of the data communication link by multiplying a constant signal transmission speed with the delay parameter, wherein the estimate of the length has a resolution that is substantially equivalent to a length estimate based on data transmission at the second data rate.

17. The system of claim 11, wherein the transmitter is further configured to:
    shift a phase of a data symbol from among the plurality of data symbols with the phase shift number of shifting sampling phases to generate a series of data symbols; and
    transmit the series of data symbols at the second data rate.

18. The system of claim 11, further comprising:
    a matching filter configured to apply to the reflection signal to reduce reflection tail noise, wherein the matching filter increases a signal-to-noise ratio of the analog reflection signal.

19. The system of claim 18, wherein the matching filter includes a plurality of matching filter coefficients determined based at least in part on a shape characteristic of the reflection signal at an end of the data communication link, a connector reflection, or a bus interface network of the wired data communication link.

20. The system of claim 19, wherein the plurality of matching filter coefficients are dynamically updated based at least in part on a shape of the reflection signal to reduce reflection tail noise.

* * * * *